US006368888B1

(12) United States Patent
Joyce et al.

(10) Patent No.: US 6,368,888 B1
(45) **Date of Patent: *Apr. 9, 2002**

(54) SOLDERING AN OPTICAL COMPONENT TO A SUBSTRATE

(75) Inventors: William Baxter Joyce, Basking Ridge, NJ (US); Daniel Paul Wilt, Orefield, PA (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/252,724

(22) Filed: Feb. 19, 1999

Related U.S. Application Data

(62) Division of application No. 08/948,695, filed on Oct. 10, 1997, now Pat. No. 5,960,017.

(51) Int. Cl.[7] .......... H01C 21/00

(52) U.S. Cl. .......... 438/22; 438/27; 438/29; 438/118; 438/122

(58) Field of Search .......... 438/22, 27, 29, 438/106, 118, 121, 122

(56) References Cited

U.S. PATENT DOCUMENTS 5,960,017 A * 9/1999 Joyce et al.

* cited by examiner

*Primary Examiner*—Kevin M. Picardat
*Assistant Examiner*—D. M. Collins
(74) *Attorney, Agent, or Firm*—Lester H. Birnbaum

(57) ABSTRACT

The invention is an assembly and method for bonding an optical component to a base member. The component is mounted to a block which includes a centerline extending between two opposing surfaces. A pair of stop members are included on the surface of the base member, and these members serve to pin the centerline during heating and cooling of the assembly so that the position of the component is controlled.

7 Claims, 1 Drawing Sheet

SOLDERING AN OPTICAL COMPONENT TO A SUBSTRATE

This is a divisional of application Ser. No. 08/948,695 filed on Oct. 10, 1997 now U.S. Pat. No. 5,960,017.

FIELD OF THE INVENTION

This invention relates to optoelectronics, and in particular to soldering a component to a substrate.

BACKGROUND OF THE INVENTION

In the field of optoelectronics, it has become increasingly important when mounting a light emitting device such as a laser to a base member to precisely control the position of the laser in order to ensure maximum light coupling to an optical fiber. Such positioning, therefore, is a key factor in determining the performance of the transmitter and the system of which it is a part. Often, if a device varies by only 1 micron from its nominal position, the assembly may be rendered worthless.

Typically, a device such as a laser is attached to a block of material such as Ag, which block is then soldered to the base member, which is typically a header comprising a steel alloy such as Kovar. Since the solder tends to creep, and the block usually has a thermal coefficient of expansion different from the base, the position of the laser can vary over a significant range from a coupling standpoint, e.g., approximately 1 micron. Sometimes a stop is used to hold the block in place at one edge. If the block is also soldered to the stop, the laser position will change due to solder creep. If the block is not soldered to the stop, the final position is unpredictable because of small variations in the solder thickness at the base of the block.

It is, therefore, desirable to provide a method and structure which provides an accurate positioning of a component which is soldered to a substrate.

SUMMARY OF THE INVENTION

The invention in accordance with one aspect is an optical assembly which includes a base member, a block of material soldered to the base member, the block including a centerline extending between first and second surfaces, and an optical component mounted on a third surface of the block. A pair of stop members are provided on the base member and make contact with the block at a surface other than the third surface, preferably at approximately the centerline of the block.

In accordance with another aspect, the invention is a method of bonding an optical component to a base member which includes the steps of mounting the component to a surface of a block of material having a centerline between first and second opposing surfaces, providing a base member having a pair of stop elements on a major surface thereof, and soldering the block to the surface of the base member while the stops make physical contact with the block at a surface other than that to which the component is mounted, preferably at approximately the centerline of the block.

BRIEF DESCRIPTION OF THE DRAWINGS

These and other features of the invention are delineated in detail in the following description. In the drawing.

It will be appreciated that, for purposes of illustration, these figures are not necessarily drawn to scale.

DETAILED DESCRIPTION

Figure 1:
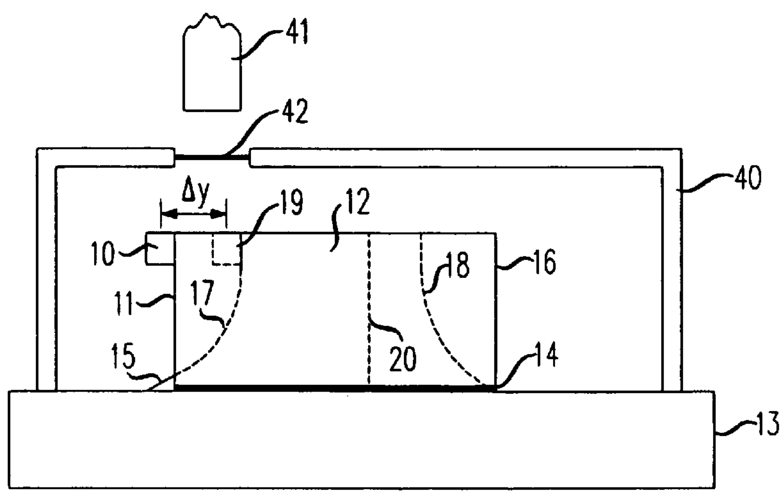
FIG. 1 is a side view, partly schematic, of an assembly including an optical component bonded to a substrate in accordance with the prior art.

Referring now to the drawings, in which like reference numerals identify similar or identical elements, FIG. 1 illustrates an example of a prior art approach to solder bonding and the resulting deformations of the soldered assembly. A light emitting device, 10, such as a laser is mounted to one surface, 11, of a block, 12, of material such as Ag. The block is typically a cube or rectangular shape. The laser is typically mounted by soldering with a AuSn eutectic solder (80% Au, 20% Sn). The block, 12, is soldered to a major surface of a base member, 13, utilizing a layer, 14, of solder which is typically a different gold-tin eutectic (10% Au, 90% Sn). A stop member, 15, is also provided on the surface of the base member, 13, in order to physically contact the surface, 11, and thereby hold the block in position. Typically, the base member, 13, and the stop member, 15, are made of Kovar, with the stop member being integral with the base member. The block, 11, and laser, 10, are enclosed by a cap, 40, which is also typically made of Kovar and includes a transparent window, 42, in a top portion. An optical fiber, 41, is subsequently provided in alignment with the laser, 19, to receive the light from the laser when the laser is in its final position, 19, as described below.

The solid lines of the block, 12, illustrate the shape of the block just before the soldering operation. The operation typically involves heating the assembly to a temperature within the range 180 to 220 deg C for a period within the range 1 second to 60 seconds when using a standard gold-tin (10%/90%) solder, 14. The dashed lines, 17 and 18, indicate the approximate shapes of the surfaces, 11 and 16, respectively, of the block after cooling of the assembly to room temperature. The distortions of the surfaces, 11 and 16, (greatly exaggerated) are caused by the shrinkage of the block due to cooling. It will be noted that the distortions cause the the laser, 10, to now occupy the position illustrated by the dashed line box, 19. Thus, the position of the laser, 10, has been altered by an amount, $\Delta y$. The fiber 41 is then aligned to laser, 19. The bottom surface of the block does not shrink since it is held in place by the stop, 15. However, over time as the solder relaxes, the bottom surface will also shrink. Since the surface, 11, is held by the stop, 15, the right surface, 16, will move, causing it to eventually occupy the position indicated by dotted line, 20. This shrinkage causes the top portion to also move to the left such that the surface, 11, tends to return to its initial position 10. This means that the laser will be out of alignment with the fiber, 41, over a period of time (typically a period of months).

Figure 2:
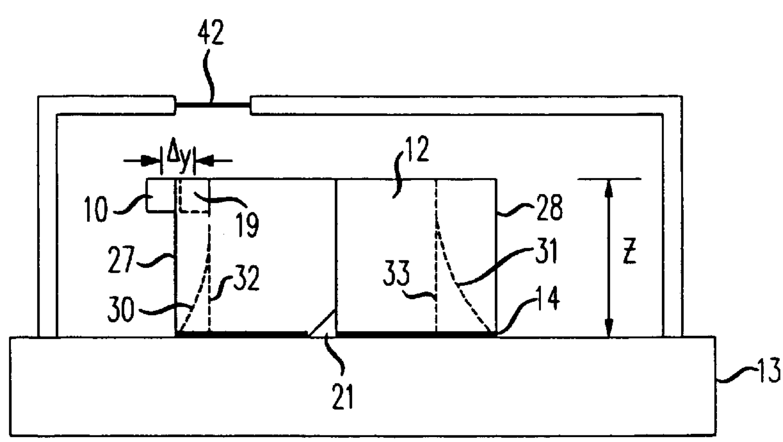
FIGS. 2 and 3 are side and top views, respectively, of an assembly including an optical component bonded to a substrate in accordance with an embodiment of the invention.
Figure 3:
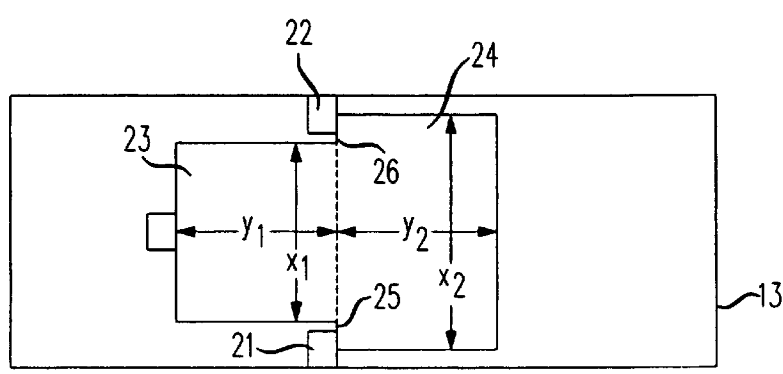

As illustrated in FIGS. 2 and 3, the present invention employs a different mechanism to hold the block in place. A pair of stop members, 21 and 22, are provided on the surface of the base member, 13. The stop members are placed sufficiently apart so that at least a portion, 23, of the block, 12, can be inserted therebetween. The block itself is shaped into a relatively narrow portion, 23, and a relatively wider portion, 24, so as to form ledges, 25 and 26, at the boundary of the two portions which contact respective stop members, 21 and 22. In a preferred embodiment, the boundary of the two portions, 23 and 24, occurs at approximately the centerline of the block, 12. That is, the length, $y_1$, of portion 23 is approximately equal to the length, $y_2$, of portion 24 so that the stop members, 21 and 22, are tied to the centerline of the block, 12. In actual practice, it is expected that best results can be achieved if the stop members are offset no more than 10 percent of the distance (e.g., $y_1$) from the centerline to the side surfaces (e.g., 27). If, however, a design is chosen with $x_1$ substantially less than $x_2$ or Z appreciably less than $y_1+y_2$, offset of more than 10% could be more attractive.

As before, the block, 12, is soldered to the base member, 13, using a layer of solder, 14, between the block and base member. The stop members, 21 and 22, are also soldered to the block, 12, at the ledges, 25 and 26. Again, solid lines indicate the shape of the block, 12, including the surfaces 27 and 28, before heating of the assembly. Dashed lines, 30 and 31, illustrate the sides of the block, just after cooling following the solder heating step. It will be noted again that the position of the laser, 10, has shifted by an amount $\Delta y$ to the position indicated by the box, 19, as a result of the distortion of the surface, 27, on which it is mounted so that the laser is in proper alignment with the window, 42. The dotted lines, 32 and 33, illustrate the shape and position of the surfaces, 27 and 28, after solder relaxation. Since the centerline of the block, 12, is pinned by the stop members, 21 and 22, both left and right surfaces, 27 and 28, near the bottom of the block will experience shrinkage. This allows the top portion of surface 27 to remain in place and, consequently, the laser remains in the position indicated by the box, 19, after solder relaxation.

The invention claimed is:

1. A method of bonding an optical component to a base member comprising the steps of:

mounting the component to a surface of a block of material having a centerline extending between first and second opposing surfaces;

providing a base member having a pair of stop members on a major surface thereof; and soldering the block to the surface of the base member while the stops make physical contact with the block at a surface other than the surface to which the component is mounted and aligning said component with an optical fiber.

2. The method according to claim 1 wherein the stops make physical contact at approximately the centerline of the block.

3. The method according to claim 1 wherein the block includes a relatively narrow portion and a relatively wide portion with the centerline defining the boundary between the portions, and the narrow portion is inserted between the stop members prior to soldering.

4. The method according to claim 3 wherein a pair of ledges are also formed between the narrow portion and the wide portion, and the block is positioned so that the stop members make contact with the ledges.

5. The method according to claim 1 wherein the block is soldered to the base member by providing a solder between a bottom surface of the block and the base member, and the resulting assembly is heated to a peak temperature within the range 180 to 220 deg C followed by cooling to room temperature.

6. The method according to claim 1 wherein the optical component is bonded to a surface of the block which is essentially parallel to the centerline.

7. The method according to claim 1 wherein the stop members are positioned a distance from the centerline which is no more than 10 percent of the distance between the centerline and the surface to which the optical component is bonded.

* * * * *